United States Patent
Coxe, III (10) Patent No.: US 7,742,844 B2
(45) Date of Patent: Jun. 22, 2010

(54) INFORMATION HANDLING SYSTEM INCLUDING COOLING DEVICES AND METHODS OF USE THEREOF

(75) Inventor: William K. Coxe, III, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 257 days.

(21) Appl. No.: 12/106,550

(22) Filed: Apr. 21, 2008

(65) Prior Publication Data

US 2009/0265045 A1 Oct. 22, 2009

(51) Int. Cl.
- G05D 23/00 (2006.01)
- G06F 19/00 (2006.01)
- F28F 27/00 (2006.01)
- B60H 1/00 (2006.01)

(52) U.S. Cl. .................. 700/300; 700/210; 165/200; 165/203

(58) Field of Classification Search ............... 700/300, 700/210; 165/200, 203
See application file for complete search history.

(56) References Cited

U.S. PATENT DOCUMENTS

| | | | |
|---|---|---|---|
| 6,777,900 B2 * | 8/2004 | Lee | 318/268 |
| 6,826,456 B1 * | 11/2004 | Irving et al. | 700/299 |
| 6,961,242 B2 * | 11/2005 | Espinoza-Ibarra et al. | 361/695 |
| 7,064,511 B2 | 6/2006 | Marando et al. | |
| 7,295,897 B2 * | 11/2007 | Marando et al. | 700/278 |
| 2003/0182021 A1 * | 9/2003 | Kidder | 700/277 |
| 2005/0256612 A1 * | 11/2005 | Linehan et al. | 700/277 |

OTHER PUBLICATIONS

Coxe, K.C. "Thermal Design of the Dell Poweredge M_Series", Dell Enterprise White Paper, Feb. 20, 2008, 13 pgs. <http://www.dell.com/downloads/global/products/pedge/en/pedge_mseries_thermal_design.pdf>.

Loffink, John. "Dell PowerEdge M1000e Modular Enclosure Architecture", Dell Enterprise White Paper, Jan. 2008, 42 pages. <http://www.dell.com/downloads/global/products/pedge/en/pedge_m1000e_white_paper.pdf>.

* cited by examiner

Primary Examiner—Albert DeCady
Assistant Examiner—Sivalingam Sivanesan
(74) Attorney, Agent, or Firm—Larson Newman & Abel, LLP (57) ABSTRACT

An information handling system can include cooling devices that are organized into zones. A method of using an information handling system can include setting a cooling level for each cooling device. Each zone can be associated with thermal data or regions within the information handling system, and a cooling demand can be determined for the thermal data or regions. A zone cooling level for each zone corresponds to a higher cooling demand from each zone's associated thermal regions, and a cooling device cooling level corresponds to a higher zone cooling level from each cooling device's associated zones. The method can be embodied as machine executable code for an information handling system. An information handling system can include cooling devices associated with zones, and can operate to set a cooling level for each cooling device by determining cooling demands in response to information regarding thermal energy generated by an electrical sub-assembly.

20 Claims, 7 Drawing Sheets

| THERMAL REGION | DEVICES | ZONES | FANS |
|---|---|---|---|
| 902 | 310, 312 | 802 | 410, 412, 414 |
| 904 | 314, 316, 318, 320, 322, 324 | 802, 804 | 410, 412, 414, 416, 418, 420 |
| 906 | 326, 328, 330, 332, 334, 336 | 804, 806 | 416, 418, 420, 422, 424, 426 |
| 908 | 338, 340 | 806 | 422, 424, 426 |
| 910 | 430, 432 | 812 | 414, 420, 426 |

INFORMATION HANDLING SYSTEM INCLUDING COOLING DEVICES AND METHODS OF USE THEREOF

FIELD OF THE DISCLOSURE

This disclosure relates generally to an information handling system, and more particularly to methods of controlling the cooling devices in an information handling system.

BACKGROUND

As the value and use of information continues to increase, individuals and businesses seek additional ways to process and store information. One option is an information handling system. An information handling system generally processes, compiles, stores, and/or communicates information, or data for business, personal, or other purposes. Because technology, information handling needs, and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware, firmware, and software components that may be configured to process, store, and communicate information, and may include one or more computer systems, data storage systems, and networking systems.

Information handling systems generate heat as a result of their operation, and as they become more powerful, the amount of heat generated also increases. Cooling fans or other cooling devices are used in an information handling system to dissipate the heat and keep the information handling system operating within acceptable temperature ranges. Additionally, in applications where large numbers of information handling systems are operated in close proximity (e.g., data processing centers), air conditioning units remove the heat from the environment surrounding the information handling systems. As such, a significant portion of the overall power consumption in a data processing center is devoted to cooling, and any improvement in cooling efficiency may result in a lower operating cost.

Typically, the information handling systems in a data processing center include groups of blade servers in a modular enclosure or chassis. The chassis can be equipped with groups of cooling fans that run at substantially the same speed, as determined by the hottest temperature of a blade server or input/output (I/O) component in the chassis. In an example, the fans in a chassis are grouped by columns, the blade servers are placed vertically in the chassis, and several blade servers control the fan speed for each column of fans. This arrangement leads to running some fans at a higher speed than necessary to cool each particular blade server. This is a problem because the power consumed by a fan increases with the cube of the fan revolutions per minute (RPM) (i.e., Power$\propto$(RPM)$^3$). The arrangement also leads to overcooling of the blade servers that are not running hot, and results in cooler exhaust air being discharged from the chassis. Also, a larger air flow causes a greater load on air conditioning, air handling, and filtration systems, thus increasing operating costs.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are illustrated and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be utilized in this application. The teachings can also be utilized in other applications, and with several different types of architectures such as distributed computing architectures, client/server architectures, or middleware server architectures, and associated components.

For purposes of this disclosure, an information handling system can include any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a PDA, a consumer electronic device, a network server or storage device, a switch router, wireless router, or other network communication device, or any other suitable device, and can vary in size, shape, performance, functionality, and price. An information handling system can also include a set of any of the foregoing devices. In a particular embodiment, an information handling system can include a rack server. The information handling system can include memory (volatile (e.g. random access memory, etc.), nonvolatile (read only memory, flash memory etc.) or any combination thereof), one or more processing resources, such as a central processing unit (CPU), hardware or software control logic, or any combination thereof. Additional components of the information handling system can include one or more storage devices, one or more communications ports for communicating with external devices as well as various input and output (I/O) devices, such as a keyboard, a mouse, a video display, or any combination thereof. The information handling system can also include one or more buses operable to transmit communications between the various hardware components. Portions of an information handling system may themselves be considered information handling systems.

Portions of an information handling system, when referred to as a "device," a "module," or the like, may be configured as hardware, firmware, software, or any combination thereof. For example, a device or a module may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). Similarly, the device could be firmware (such as any software running on an embedded device, a Pentium class or PowerPC™ brand processor, or other such device) or software (such as any software capable of operating in the relevant environment). The device could also be a combination of any of the foregoing examples of hardware, firmware, or software. Note that an information handling system can include an integrated circuit or a board-level product having portions thereof that can also be any combination of hardware or software.

Devices or programs that are in communication with one another need not be in continuous communication with each other unless expressly specified otherwise. In addition, devices or programs that are in communication with one another may communicate directly or indirectly through one or more intermediaries.

Embodiments discussed below describe, in part, distributed computing solutions that manage all or part of a communicative interaction between network elements. In this context, a communicative interaction may be intending to send information, sending information, requesting information, receiving information, receiving a request for information, or any combination thereof. As such, a communicative interaction could be unidirectional, bi-directional, multi-directional, or any combination thereof. In some circumstances, a communicative interaction could be relatively complex, and involve two or more network elements. For example, a communicative interaction may be "a conversation," or series of related communications between a client and a server—each network element sending and receiving information to and from the other. Whatever form the communicative interaction takes, the network elements involved need not take any specific form. A network element may be a node, a piece of hardware, software, firmware, middleware, some other component of a computing system, or any combination thereof.

In the description below, a flow charted technique may be described in a series of sequential actions. The sequence of the actions, and the party performing the steps may be freely changed without departing from the scope of the teachings. Actions may be added, deleted, or altered in several ways. Similarly, the actions may be re-ordered or looped. Further, although processes, methods, algorithms or the like may be described in a sequential order, such processes, methods, algorithms, or any combination thereof may be operable to be performed in alternative orders. Further, some actions within a process, method, or algorithm may be performed simultaneously during at least a point in time (e.g., actions performed in parallel), can also be performed in whole, in part, or any combination thereof.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or, and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience, and to give a general sense of the scope of the invention. This description should be read to include one or at least one, and the singular also includes the plural, or vice versa, unless it is clear that it is meant otherwise. For example, when a single device is described herein, more than one device may be used in place of a single device. Similarly, where more than one device is described herein, a single device may be substituted for that one device.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only, and not intended to be limiting.

To the extent not described herein, many details regarding specific materials, processing acts, and circuits are conventional, and may be found in textbooks and other sources within the computing, electronics, and software arts.

An information handling system, and method of using it are described below. An exemplary, non-limiting system description is described before addressing methods of using it. Some of the functionality of modules within the system is described with the system. The utility of the system, and its modules will become more apparent with the description of the methods that follow the description of the system and modules.

Figure 1:
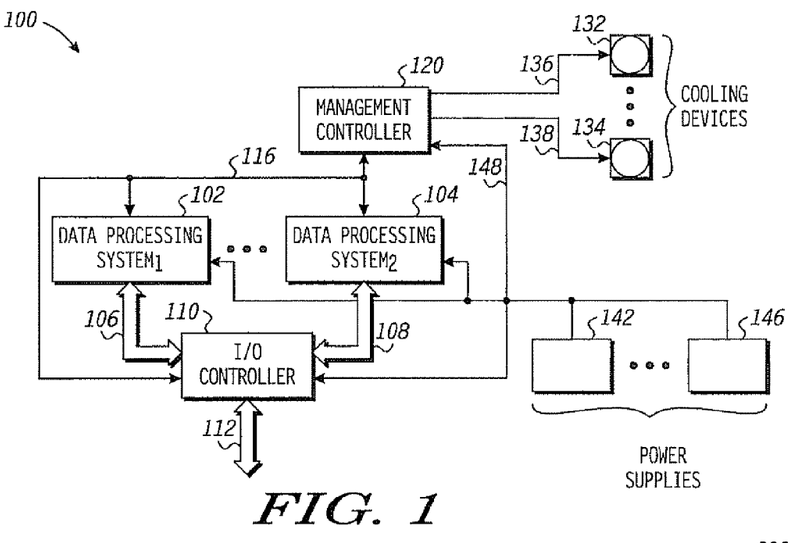
FIG. 1 illustrates a functional block diagram of an information handling system including a management controller and cooling devices.

FIG. 1 illustrates a functional block diagram of an exemplary embodiment of an information handling system, generally designated as 100. The information handling system 100 can include a data processing system 102 connected to an input/output (I/O) channel 106. The information handling system 100 can further include one or more additional data processing systems generally designated as an $n^{th}$ data processing system 104 coupled to an $n^{th}$ I/O channel 108. A non-limiting example of a data processing systems 102 through 104 can include an individual computer (e.g., desktop computer, server, etc.), a rack-mounted computer (e.g., rack server), a modular computer (e.g., blade server) that is placed in a chassis or other modular enclosure, or any combination thereof.

The data processing system 102 can be coupled to an I/O controller 110 via the I/O channel 106, and the $n^{th}$ data processing system 104 can be coupled to the I/O controller 110 via the $n^{th}$ I/O channel 108. The I/O controller 110 can support the data processing systems 102 through 104 by allowing for simultaneous processing of information in the data processing systems 102 through 104, and the exchange of information within the information handling system 100 during multiple processing operations. The I/O controller 100 further can be coupled to an external resource (not illustrated) via an external I/O channel 112. The external resource can include another information handling system, a data storage system, an external networking capability, another suitable function, or any combination thereof. The I/O controller 110 can be implemented as a single controller that supports multiple data processing systems and external resources, or as different controllers that divide up the data processing system and the external resource support functions. Furthermore, the I/O channels 106 through 108 and 112 can be of industry standard architectures (e.g., InfiniBand, Fibre Channel, Gb Ethernet, etc.), proprietary channels, or any combination thereof.

The information handling system 100 can further include a system management controller 120. The system management controller 120 can be connected to the data processing system 102, the $n^{th}$ data processing system 104, the I/O controller 110, or any combination thereof, through a system communication bus 116. The system communication bus 116 can be an Inter-Integrated Circuit ($I^2C$) bus, a System Management (SM) bus, another suitable communication medium, or any combination thereof. The system communication bus 116 can also be implemented as individual communication channels between the system management controller 120 and the data processing systems 102 through 104 and the I/O controller 110.

The information handling system 100 can also include a cooling device 132, and can further include one or more additional cooling devices generally designated as an $n^{th}$ cooling device 134. The cooling devices 132 through 134 can be coupled to the system management controller 120 through a cooling device interface 136, and an $n^{th}$ cooling device interface 138, respectively. The system management controller 120 can receive temperature data, cooling demand data, other suitable data, or any combination thereof, from the data processing systems 102 through 104, and the I/O controller 110 over the system communication bus 116. The system management controller 120 can translate the data into one or more cooling device outputs to be sent to each of the cooling devices 132 through 134. A non-limiting example of a cooling device 132 through 134 is a fan, a piezoelectric device, a liquid cooling circulation device, another device or system designed to provide cooling or to remove heat, or any combination thereof. As illustrated, the cooling devices 132 through 134 can receive power via the cooling device interfaces 136 through 138. In another embodiment (not illustrated) the cooling devices 132 through 134 can receive power from a separate source in addition to, or instead of receiving power via the cooling device interfaces 136 through 138. Regardless of the power configuration, the cooling device interfaces 136 through 138 include a data bus carrying cooling device output data to each cooling device 132 through 134.

The information handling system 100 can also include a power supply 142 coupled to a power bus 148, and can further include one or more additional power supplies generally designated as an $n^{th}$ power supply 144 that are also coupled to the power bus 148. The power supplies 142 through 144 can provide power via the power bus 148 to the data processing systems 102 through 104, the I/O controller 110, and the management controller 120, to other parts of the information handling system 100, or any combination thereof. In a particular embodiment, the data processing system 102 can include a separate power supply that provides system power, as is the case with a data processing system 102 through 104 that is a stand-alone computer system. Likewise, the $n^{th}$ data processing system 104, the I/O controller 110, the management controller 120 or any combination thereof can include separate power supplies that provide system power to each element. Skilled artisans will appreciate that the information handling system 100 can derive system power from a combination of the above alternatives, as needed, or desired. As used below, the term "element" of the information handling system 100 can include the data processing system 102 or 104, the I/O controller 110, the management controller 120, the power supply 142 or 144, or any combination thereof.

Figure 2:
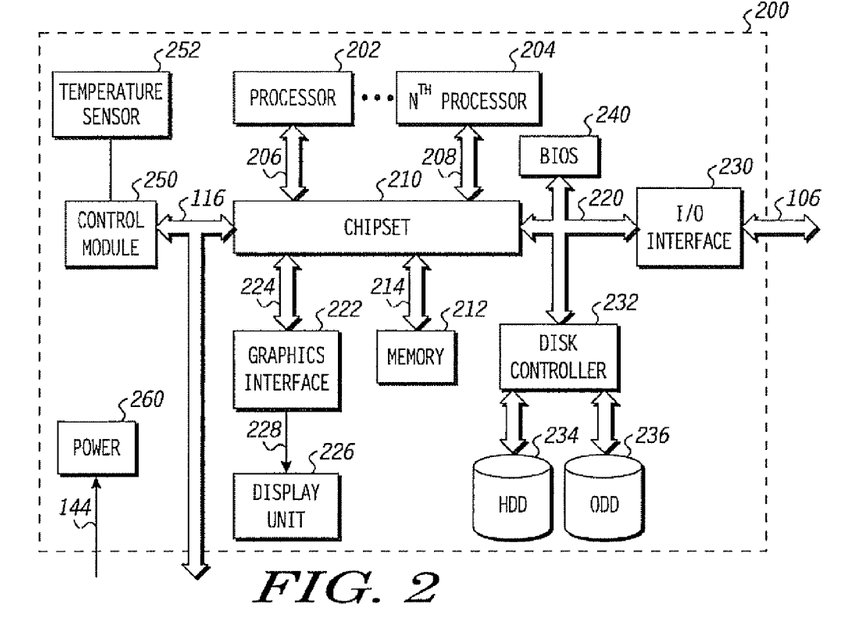
FIG. 2 illustrates a functional block diagram of a data processing system including a system communication bus.

FIG. 2 illustrates a functional block diagram of an exemplary embodiment of the data processing system 102 or 104, generally designated as 200. The data processing system 200 can include a processor 202 coupled to a host bus 206, and can further include one or more additional processors generally designated as an $n^{th}$ processor 204 coupled to a host bus 208. The processor 202 can be coupled to a chipset 210 via the host bus 206. Further, the $n^{th}$ processor 204 can be coupled to the chipset 210 via the host bus 208. The chipset 210 can support the processors 202 through 204, allowing for simultaneous processing of the processors 202 through 204, and can support the exchange of information within information handling system 200 during multiple processing operations.

According to an aspect, the chipset 210 can be referred to as a memory hub, or a memory controller. For example, the chipset 210 can include an Accelerated Hub Architecture (AHA) enabled chipset that uses a dedicated bus to transfer data between processor 202, and the n processor 204. An AHA enabled-chipset can include a memory controller hub, and an input/output (I/O) controller hub. As a memory controller hub, the chipset 210 can function to provide access to the processors 202 through 204 via the host buses 206 through 208, respectively, and can also provide a memory interface for accessing a memory 212 via a host bus 214. In a particular embodiment, the host buses 206 through 208, and 214 can be individual buses, or part of the same bus. The chipset 210 can also provide bus control, and can handle data transfers between the host buses 206 through 208, and 214. According to another aspect, the chipset 210 can be generally considered an application specific chipset that provides connectivity to various buses, and integrates other system functions. For example, the chipset 210 can be provided using a chipset that includes two parts, a Graphics and AGP Memory Controller Hub (GMCH), and an I/O Controller Hub (ICH). The chipset 210 can also be packaged as an ASIC.

The data processing system 200 can also include a graphics interface 222 that can be coupled to the chipset 210 via the host bus 224. In one form, the graphics interface 222 can be an Accelerated Graphics Port (AGP) interface to display content within a video display unit 226. Another graphics interface (not illustrated) may also be used in addition to the graphics interface 222 if needed, or desired. The graphics interface 222 can provide a display output 228 to the display unit 226. The display unit 226 can include one or more types of video displays, such as a flat panel display, or other type of display device.

The data processing system 200 can also include an I/O interface 230 that can be connected via an I/O bus 220 to the chipset 210. The I/O bus 220 and the I/O interface 230 can include industry standard buses, or proprietary buses and respective interfaces or controllers, or any combination thereof. The I/O interface 230 includes an I/O channel, such as I/O channel 106, to connect to an I/O controller, such as the I/O controller 110 in the information handling system 100. The I/O bus 220 can also include a Peripheral Component Interconnect (PCI) bus, or a high speed PCI-Express bus. In one embodiment, a PCI bus can be operated at approximately 66 MHz, and a PCI-Express bus can be operated at approximately 128 MHz. PCI buses and PCI-Express buses can be provided to comply with industry standards for connecting and communicating between various PCI-enabled hardware devices. Other buses can also be provided in association with, or independent of, the I/O bus 220 including other industry standard buses, or proprietary buses, such as Industry Standard Architecture (ISA), Small Computer Serial Interface (SCSI), $I^2C$, System Packet Interface (SPI), Universal Serial Bus (USB), or any combination thereof.

In an alternative embodiment, the chipset 210 can be a chipset employing a Northbridge/Southbridge chipset configuration (not illustrated). For example, a Northbridge portion of the chipset 210 can communicate with the processors 202 through 204 via the host buses 206 through 208, and can control interaction with the memory 212, the I/O bus 220, and activities for the video graphics interface 222. The chipset 210 can also include a Southbridge portion (not illustrated) of the chipset 210 that can handle I/O functions of the chipset 210. The Southbridge portion can manage basic forms of I/O, such as USB, serial I/O, audio outputs, Integrated Drive Electronics (IDE), ISA I/O, or any combination thereof for the data processing system 200.

The data processing system 200 can further include a disk controller 232 coupled to the I/O bus 220. The disk controller 232 can be used to connect one or more disk drives such as a hard disk drive (HDD) 234, and an optical disk drive (ODD) 236 such as a Read/Write Compact Disk (R/W-CD), a Read/Write Digital Video Disk (R/W-DVD), a Read/Write mini Digital Video Disk (R/W mini-DVD), or other type of optical disk drive. Alternatively, the disk controller 232 may be coupled to a solid-state drive (not illustrated) in addition to, or instead of the HDD 234 or ODD 236.

The data processing system 200 can also include a basic input/output system (BIOS) module 240 that can be coupled to the I/O bus 220. The BIOS module 240 is operable to detect and identify resources within the data processing system 200, and to provide the appropriate drivers for those resources. The BIOS module 240 can be operable during a boot sequence, and provide information needed to properly boot the data processing system 200 before, during, and after an operating system for the data processing system 200 is launched.

The data processing system 200 can further include a control module 250 that can be coupled to the chipset 210 via a system communication bus 116, such as a control bus. Although not illustrated, other components, such as the processors 202 through 204, the graphics interface 222, the display unit 226, the memory 212, or the disk controller 232, or any combination thereof can be coupled to the control module 250. Commands, communications, or other signals may be sent to or received from the control module 250 by any one or combination of components previously described. The control module 250 can be part of an integrated circuit, or a chip set within the data processing system 200, and can reside on a main circuit board, such as a baseboard, a motherboard, or the like. The control module 250 can be coupled to one or more temperature sensors 252 to gather temperature data from the data processing system 200. The control module 250 can receive the temperature sensor 252 data, and translate it into temperature data, cooling demand data, other suitable data, or any combination thereof for the data processing system 200. The control module 250 can be connected to the system management controller 120 in the information handling system 100 by the system communication bus 116. The control module 250 can communicate the temperature data, cooling demand data, or other suitable data to the system management controller 120.

The data processing system 200 can also include a system power connection 260 that receives power from the power bus 148 in the information handling system 100.

Figure 3:
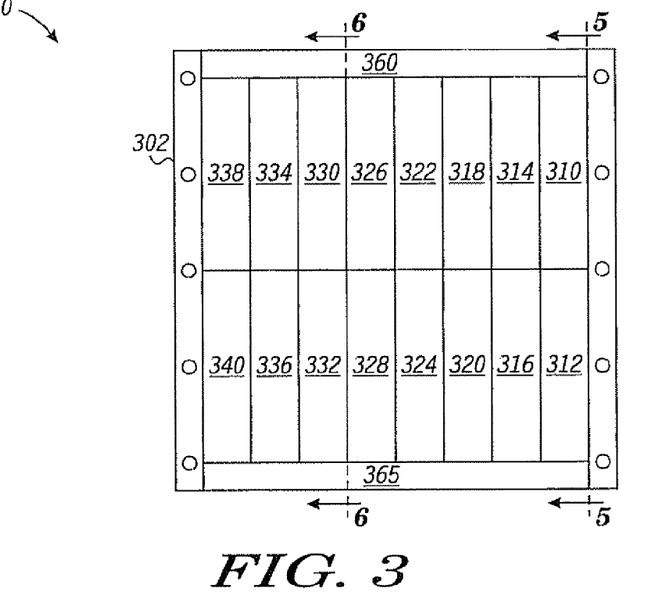
FIG. 3 illustrates a front view of a rack server.
Figure 4:
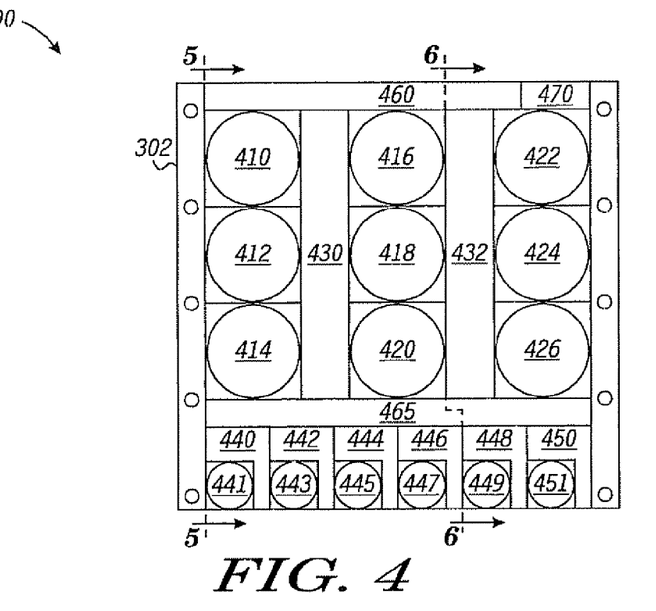
FIG. 4 illustrates a back view of the rack server of FIG. 2.

Many embodiments of the information handling system 100 can be implemented, depending on the particular application. A particular information handling system, as illustrated in FIG. 3 et seq., and described below, discloses some exemplary, non-limiting physical embodiments of an information handling system 100. Such embodiments are for illustrative purposes, and not to limit the scope of the present invention. FIGS. 3 and 4 illustrate a front view and a back view, respectively, of a rack server 300, where the rack server 300 provides similar functionality to the information handling system 100. As illustrated, sixteen blade servers 310, 312, 314, 316, 318, 320, 322, 324, 326, 328, 330, 332, 334, 336, 338, and 340 can be similar to the data processing systems 102 through 104. Two I/O modules 430 and 432 can be similar to the I/O controller 110. Nine fan modules 410, 412, 414, 416, 418, 420, 422, 424, and 426 can be similar to the cooling devices 132 through 134. Six power modules 440, 442, 444, 446, 448, and 450 can be similar to the power supplies 142 through 144. A server controller 470 can be similar to the system management controller 120. The rack server 300 includes an enclosure 302 that functions to hold the blade servers 310, 312, 314, 316, 318, 320, 322, 324, 326, 328, 330, 332, 334, 336, 338, and 340, the I/O modules 430 and 432, the fan modules 410, 412, 414, 416, 418, 420, 422, 424, and 426, the power modules 440, 442, 444, 446, 448 and 450, and the server controller 470. The enclosure 302 also includes wiring, or other interconnections (not illustrated) to couple the various components of the rack server 300 together. As such, the wiring, or other interconnections in the enclosure 302 can be similar to the I/O channels 106 through 108, the system communication bus 116, the cooling device interfaces 136 through 138, and the power bus 148. External connections (not illustrated) made with the I/O modules 430 and 432 can be similar to the external I/O channel 112.

The information handling system 100 includes the cooling devices 132 through 134 to cool elements of the information handling system. Similarly, the enclosure 302, in combination with the fan modules 410, 412, 414, 416, 418, 420, 422, 424, and 426, provide cooling for the rack server 300 by ensuring proper cooling of electrical sub-assemblies, including the blade servers 310, 312, 314, 316, 318, 320, 322, 324, 326, 328, 330, 332, 334, 336, 338, and 340, the I/O modules 430 and 432, the power modules 440, 442, 444, 446, 448, and 450, and the server controller 470 in the rack server 300. As used below, the term "component" of the rack server 300 can include the blade servers 310, 312, 314, 316, 318, 320, 322, 324, 326, 328, 330, 332, 334, 336, 338, or 340, the I/O modules 430 or 432, the server controller 470, or any combination thereof. Generally, the fan modules 410, 412, 414, 416, 418, 420, 422, 424, and 426 draw a gas (e.g., ambient air, nitrogen gas, argon gas, carbon dioxide gas, etc.) in from the front of the rack server 300, and blow heated gas out the back of the rack server 300. The gas can flow horizontally through the blade servers 310, 312, 314, 316, 318, 320, 322, 324, 326, 328, 330, 332, 334, 336, 338, and 340, from the front of the enclosure 302 to the back of the enclosure 302, and the gas can flow vertically through the I/O modules 430 and 432.

Figure 5:
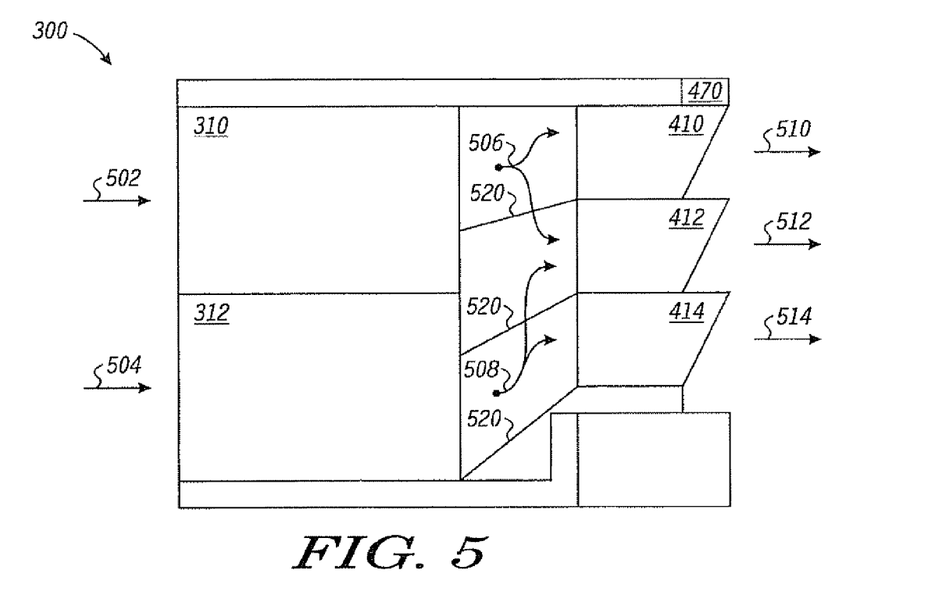
FIG. 5 illustrates a cut away view of the rack server of FIG. 2.

Cooling of the blade servers 310, 312, 314, 316, 318, 320, 322, 324, 326, 328, 330, 332, 334, 336, 338, and 340 is illustrated by example in FIG. 5, which illustrates a side view of the rack server 300 at sectioning line 5-5, as illustrated in FIGS. 3 and 4. A cool gas, illustrated by arrow 502, is drawn into the blade server 310 from the front of the rack server 300. As the cool gas 502 passes through the blade server 310, the cool gas 502 is heated by the thermal energy from the electrical circuits within the blade server 310, and the cool gas 502 becomes a heated gas, illustrated by arrow 506, that flows out the back of the blade server 310. Likewise, a cool gas, illustrated by arrow 504, is drawn into the blade server 312, is heated by the thermal energy from the electrical circuits within the blade server 312, and the cool gas 504 becomes a heated gas, illustrated by arrow 508, that flows out the back of the blade server 312. The heated gas 506 and 508 is channeled into the fan modules 410, 412, and 414 through plenums 520 to distribute the heated gas 506 and 508 to the fan modules 410, 412, and 414. The fan module 410 blows an exhaust gas, illustrated by arrow 510, out the back of the rack server 300. Likewise, the fan modules 412 and 414 blow an exhaust gas, illustrated by arrow 512, and an exhaust gas, illustrated by arrow 514, respectively, out of the rack server 300. Thus, the gas flows 502, 504, 506, 508, 510, 512, and 514 created by the fan modules 410, 412, and 414 have the most effect on the cooling of the blade servers 310 and 312, as compared to the other fan modules 416, 418, 420, 422, 424, and 426. Similarly, the cooling of the other blade server 314, 316, 318, 320, 322, 324, 326, 328, 330, 332, 334, 336, 338, and 340 will be most affected by the gas flow created by some subgroup of the fan modules 410, 412, 414, 416, 418, 420, 422, 424, and 426.

Figure 6:
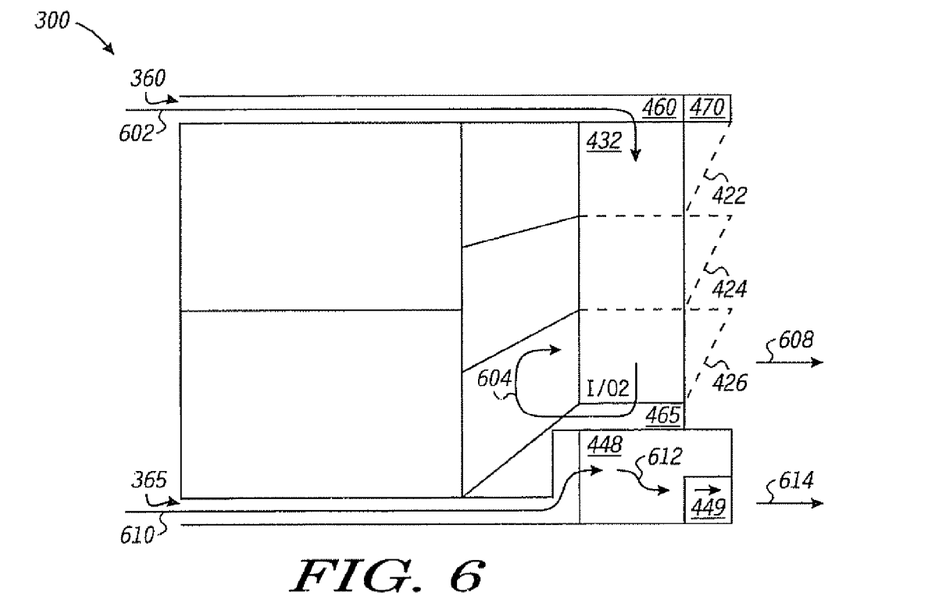
FIG. 6 illustrates a second cut away view of the rack server of FIG. 3.

An example of the cooling of the I/O modules 430 and 432, and the power modules 440, 442, 444, 446, 448, and 450 is illustrated by example in FIG. 6, which illustrates a side view of the rack server 300 at sectioning line 6-6, as illustrated in FIGS. 3 and 4. The fan module 426 draws in a cool gas, illustrated by arrow 602, into an upper air inlet 360, through an upper air gap 460, and into the top of the I/O module 432. As the cool gas 602 passes through the I/O module 432, the cool gas 602 is heated by the thermal energy from the electrical circuits within the I/O module 432, and the cool gas 602 becomes a heated gas, illustrated by arrow 604, that flows out the bottom of the I/O module 432 into the lower air gap 465. The heated gas 604 is drawn from the lower air gap 465 into the fan module 426. The fan module 426 then blows an exhaust gas, illustrated by arrow 608, out the back of the rack server 300. The air flow created by the fan modules 414, 420, and 426 have the most effect on the cooling of the I/O modules 430 and 432, as compared to the other fan modules 410, 412, 416, 418, 422, and 424.

The power modules 440, 442, 444, 446, 448, or 450 can include internal cooling fans 441, 443, 445, 447, 449, or 451, respectively, and cooling controls (not illustrated) that regulate the internal temperature of the power modules 440, 442, 444, 446, 448, and 450, independent of the fan modules 410, 412, 414, 416, 418, 420, 422, 424, and 426. As an example, the cooling fan 449 draws a cool gas, illustrated by arrow 610, into the lower air inlet 365, and into the front of the power module 448. As the cool gas 610 passes through the power module 448, the cool gas 610 is heated by the thermal energy from the electrical circuits within the power module 448, and the cool gas 610 becomes a heated gas, illustrated by arrow 612, that flows into the cooling fan 449 which blows an exhaust gas, illustrated by arrow 614, out the back of the rack server 300. Thus, the power modules 440, 442, 444, 446, 448, and 450 are substantially unaffected by the gas flow created by the fan modules 410, 412, 414, 416, 418, 420, 422, 424, and 426.

The information handling system 100 can have a different number of cooling devices 132 through 134 than the total number of the data processing systems 102 through 104, the I/O controller 110, the management controller 120, and the power supplies 142 through 144. As such, some of the cooling devices 132 through 134 can provide cooling for a particular element, a particular combination of elements can be cooled by a particular cooling device 132 or 134, or a particular combination of cooling devices 132 through 134 can provide cooling of a particular combination of elements. As such, the particular elements or combination of elements can be considered as separate thermal regions in the information handling system 100. The management controller 120 can implement a mapping function between the elements of the information handling system 100, and the cooling devices 132 through 134, and control the level of cooling (e.g., a fan speed) for each of the cooling devices 132 through 134 in accordance with the cooling needs of the associated elements. Similarly, in the rack server 300, the fan modules 410, 412, 414, 416, 418, 420, 422, 424, and 426 can each provide a gas flow that contributes to the cooling of one or more components. As such, the fan speed for each particular fan module 410, 412, 414, 416, 418, 420, 422, 424, or 426 can be set to a level sufficient to cool the hottest running component over which that particular fan module 410, 412, 414, 416, 418, 420, 422, 424, or 426 has the greatest affect.

In the information handling system 100, the management controller 120 can logically associate the cooling devices 132 through 134 into overlapping zones that provide cooling to different regions within the information handling system 100. Overlapping zones means that some of the cooling devices 132 through 134 are members of more than one zone. As such, the cooling devices 132 through 134 can be physically arranged in rows and columns, in concentric circles, on different sides, or other arrangements, as appropriate to the design of the information handling system 100. A non-limiting example of overlapping zones includes: associating the cooling devices 132 through 134 in a row into a particular zone, and the cooling devices 132 through 134 in a column into a different zone, associating the cooling devices 132 through 134 in a radius of concentric cooling devices 132 through 134 into a particular zone, and the cooling devices 132 through 134 in a quadrant into a different zone, associating the cooling devices 132 through 134 on a side into a particular zone, and the cooling devices 132 through 134 that share an edge into a different zone, or any combination thereof.

Each element in the information handling system 100 can physically reside in a thermal region within the information handling system 100 that is cooled by one or more zones of the cooling devices 132 through 134. The management controller 120 can logically associate each particular thermal region with the zone or zones that most effectively cool that particular thermal region. The management controller 120 can determine an element cooling demand for each element (e.g., as communicated by the element over the system communication bus 116), and set a region cooling demand for each particular region that corresponds to the higher element cooling demand from among the elements that are associated with each thermal region. The management controller 120 can set a zone cooling level for each particular zone that corresponds to the higher region cooling demand from among the thermal regions that are associated with each zone. The management controller 120 can also set a cooling device cooling level for each particular cooling device 132 through 134 that corresponds to the higher zone cooling level from among the zones that are associated with each cooling device 132 through 134.

Figure 7:
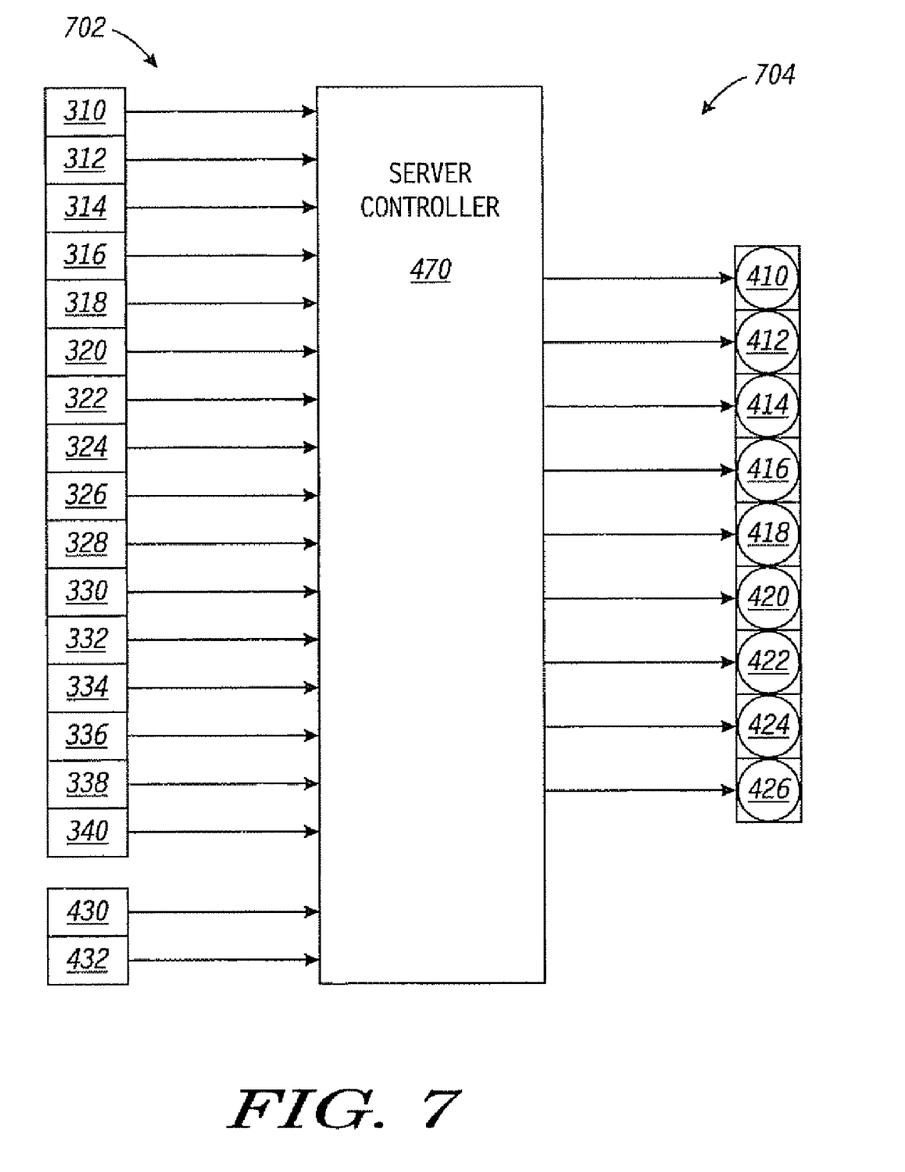
FIG. 7 illustrates a functional block diagram of a server controller and exemplary inputs and outputs for the server controller.

FIG. 7 illustrates a functional block diagram of the server controller 470 in the server rack. The server controller 470 can be similar to the management controller 120, determining the fan speed for the fan modules 410, 412, 414, 416, 418, 420, 422, 424, and 426 based upon the cooling demand from each component. The server controller 470 can receive inputs 702 from the components. Each input 702 can communicate information regarding the cooling demand for the corresponding component. The server controller 470 also has outputs 704 to the fan modules 410, 412, 414, 416, 418, 420, 422, 424, and 426. The outputs 704 can communicate information regarding the requested fan speed for the corresponding fan modules 410, 412, 414, 416, 418, 420, 422, 424, and 426. The inputs 702 and outputs 704 are illustrated as discrete signals, however, the disclosure is not limited to discrete input or output signals. After reading this specification, skilled artisans will appreciate that the cooling demand information, and fan speed information may be communicated discretely, or over a shared data bus, or a combination of discrete signals, and a shared data bus. Further, a discrete input may be analog, or digital thermal data. Also, a discrete output may be communicated as a pulse-width modulated signal, a voltage level, or other such analog, or digital techniques.

Figure 8:
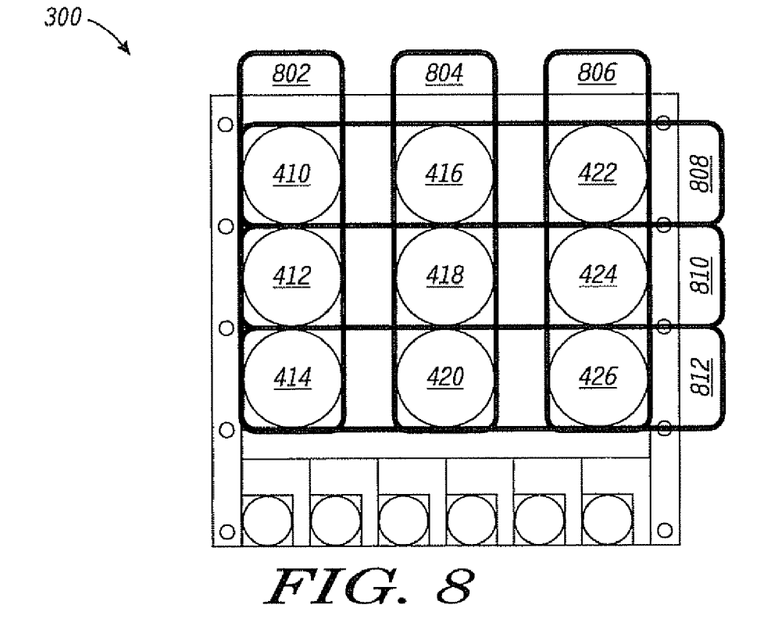
FIG. 8 illustrates a grouping of fan modules in the rack server of FIG. 3 into zones.
Figure 9:
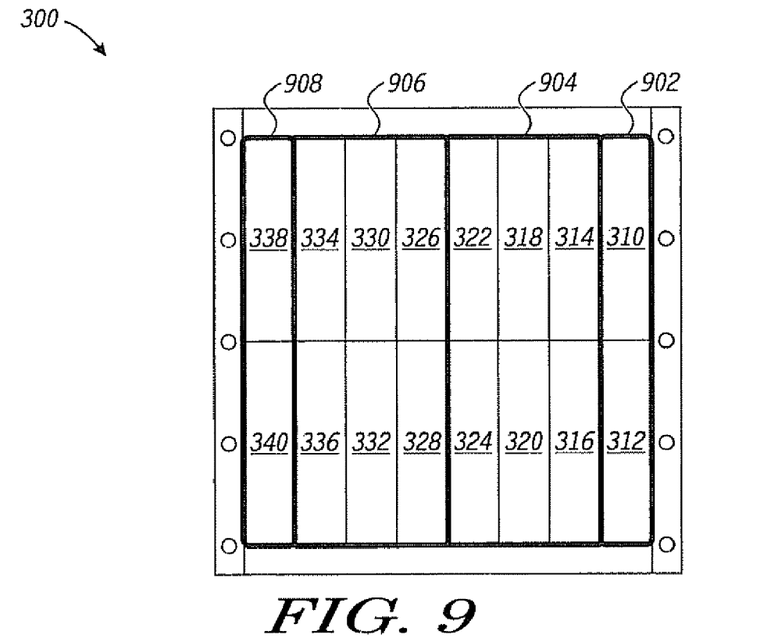
FIG. 9 illustrates a grouping of blade servers in the rack server of FIG. 3 into thermal regions.
Figure 10:
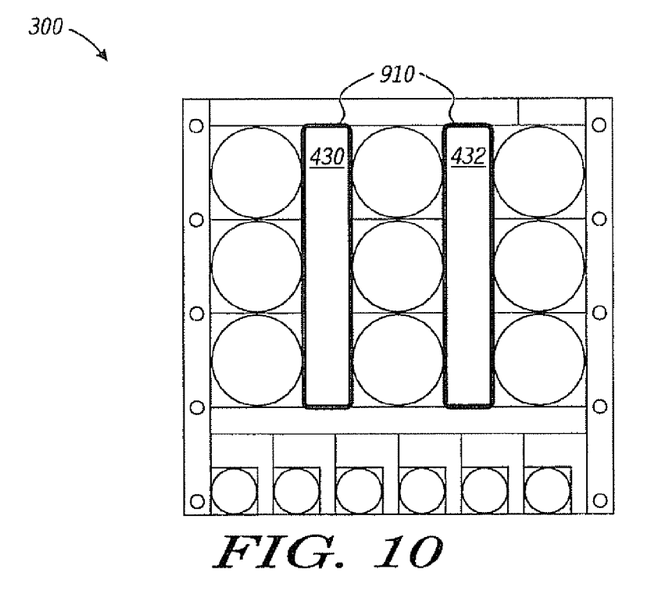
FIG. 10 illustrates a grouping of I/O modules in the rack server of FIG. 3 into a thermal region.

The server controller 470 can associate the inputs 702 corresponding to various components together into thermal regions, similar to the thermal regions describe above for the information handling system 100. The server controller can associate the outputs 704 corresponding to various combinations of fan modules 410, 412, 414, 416, 418, 420, 422, 424, and 426 together into zones, similar to the zones describe above for the information handling system 100, and create a mapping between the thermal regions and the zones. The associations and mapping in the server controller 470 can be performed in hardware, software, firmware, or any combination thereof. An example is illustrated in FIG. 8, where the fan modules 410, 412, 414, 416, 418, 420, 422, 424, and 426 are associated with the following zones: the fan modules 410, 412, and 414 with the zone 802, the fan modules 416, 418, and 420 with the zone 804, the fan modules 422, 424, and 426 with the zone 806, the fan modules 410, 416, and 422 with the zone 808, the fan modules 412, 418, and 424 with the zone 810, and the fan modules 414, 420, and 426 with the zone 812. FIG. 9 illustrates an example of the association of the blade servers 310, 312, 314, 316, 318, 320, 322, 324, 326, 328, 330, 332, 334, 336, 338, and 340 into the following thermal regions: the blade servers 310 and 312 with the region 902, the blade servers 314, 316, 318, 320, 322, and 324 with the region 904, the blade servers 326, 328, 330, 332, 334, and 336 with the region 906, and the blade servers 338 and 340 with the region 908. FIG. 10 illustrates an example of the I/O modules 430 and 432 associated together with the region 910.

Figure 11:
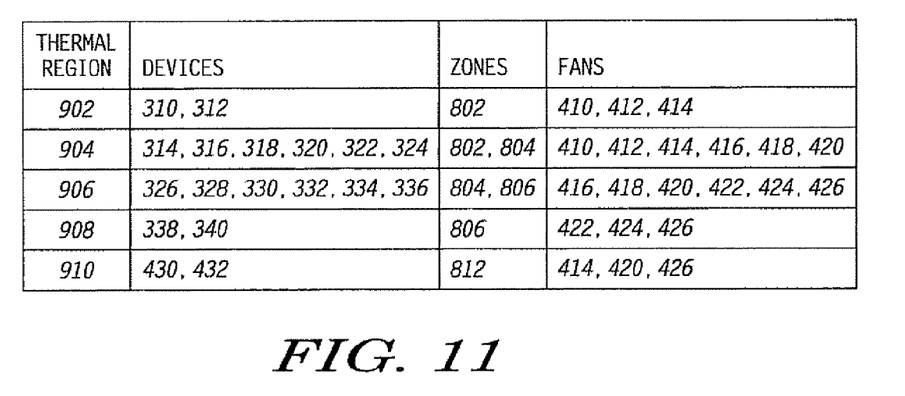
FIG. 11 illustrates a table mapping the thermal regions of FIGS. 9 and 10 to the zones of FIG. 8.

FIG. 11 includes a table illustrating the mapping between the thermal regions 902, 904, 906, 908, and 910, and the zones 802, 804, 806, 808, 810, and 812. The mapping can correspond to the actual cooling performance wherein, the fan modules 410, 412, 414, 416, 418, 420, 422, 424, and 426 provide air flow that contributes to the cooling of two or more components, as described above. The region 902 maps to the zone 802, corresponding to the cooling relationship between the blade servers 310 and 312, and the fan modules 410, 412, and 414. The region 904 maps to the zones 802 and 804, indicating a cooling relationship between the blade servers 314, 316, 318, 320, 322, and 324, and the fan modules 410, 412, 414, 416, 418, and 420. Likewise, the region 906 maps to the zones 804 and 806, and the region 908 maps to the zone 806. The region 910 maps to the zone 812, corresponding to the cooling relationship between I/O modules 430 and 432, and the fan modules 414, 420, and 426. In this embodiment, no thermal regions 902, 904, 906, 908, or 910 map to the zones 808 or 812.

The server controller 470 can determine a component cooling demand, similar to the element cooling demand described above for the information handling system 100, for each component by polling, or receiving the corresponding input 702. The component cooling demands for each component associated with a particular thermal region 902, 904, 906, 908, or 910 can be compared to each other, and a region cooling demand, similar to the region cooling demand described above for the information handling system 100, for that particular thermal region 902, 904, 906, 908, or 910 can be set to correspond with the higher component cooling demand from among the associated components for that particular thermal region 902, 904, 906, 908, or 910. For illustrative purposes, consider the following example. If the blade server 310 has an component cooling demand of 7000 RPM, and the blade server 312 has an component cooling demand of 3000 RPM, then the region cooling demand for the region 902 is 7000 RPM. If the blade server 318 has an component cooling demand of 4000 RPM, and the blade servers 314, 316, 320, 322, and 324 all have an component cooling demands of 3000 RPM, then the region cooling demand for the region 904 is 4000 RPM. Further, if the component cooling demands for the blade servers 326, 328, 330, 332, 334, and 336 are all 3000 RPM, then the region cooling demand for the region 906 is 3000 RPM. In the region 908, if the component cooling demand for the blade server 338 is 5000 RPM, and the component cooling demand for the blade server 340 is 3000 RPM, then the region cooling demand for the region 908 is 5000 RPM. Also, if the component cooling demand for the I/O module 430 is 3000 RPM, and the component cooling demand for the I/O module 432 is 6000 RPM, then the region cooling demand for the region 610 is 6000 RPM.

Next, the server controller 470 can determine a zone cooling level, similar to the zone cooling level described above for the information handling system 100, for each zone 802, 804, 806, 808, 810, and 812 by comparing the region cooling demand for each of the thermal regions 902, 904, 906, 908, and 910 together. The zone cooling level for a particular zone 802, 804, 806, 808, 810, or 812 can be set to correspond to the higher region cooling demand from among the associated thermal regions 902, 904, 906, 908, and 910 for that particular zone 802, 804, 806, 808, 810, or 812. Using the region cooling demands from the above example, the zone 802 is associated with the region 902 which has a region cooling demand of 7000 RPM, and with the region 904 which has a region cooling demand of 4000 RPM, so the zone cooling level for the zone 802 is 7000 RPM. The zone 804 is associated with the region 904 with a region cooling demand of 4000 RPM, and with the region 906 with a region cooling demand of 3000 RPM, so the zone 804 has a zone cooling level of 4000 RPM. The zone 806 is associated with the region 906 with a region cooling demand of 3000 RPM, and with the region 908 with a region cooling demand of 5000 RPM, so the zone cooling level for the zone 806 is 5000 RPM. Also, the zone 812 is associated with only the region 810 which has a region cooling demand of 6000 RPM, so 6000 RPM is the zone cooling level for the zone 812.

Further, the server controller 470 can determine a fan cooling level, similar to the cooling device cooling level described above for the information handling system 100, for the fan modules 410, 412, 414, 416, 418, 420, 422, 424, and 426 by comparing the zone cooling level for each zone 802, 804, 806, 808, 810, and 812 together. The fan cooling level for a particular fan module 410, 412, 414, 416, 418, 420, 422, 424, or 426 is set to correspond to the higher zone cooling level from among the associated zones 802, 804, 806, 808, 810, or 812 for that particular fan module 410, 412, 414, 416, 418, 420, 422, 424, or 426. In this embodiment, because none of the thermal regions 902, 904, 906, 908, or 910 map to the zones 808 or 810, the fan modules 410 and 412 are only functionally associated with the zone 802, and so the fan cooling levels for the fan modules 410 and 412 are set to the zone 802 zone cooling level of 7000 RPM. Likewise, the fan modules 416 and 418 are only functionally associated with the zone 804, and the fan cooling levels for the fan modules 416 and 418 are set to the zone 804 zone cooling level of 4000 RPM, and the fan modules 422 and 424 are only functionally associated with the zone 806, and the fan cooling levels for the fan modules 422 and 424 are set to the zone 806 zone cooling level of 5000 RPM. The fan module 414 is associated with the zones 802 and 812, and, because the zone 802 zone cooling level is higher than the zone 812 zone cooling level, the fan cooling level for the fan module 414 is set to 7000 RPM. The fan module 420 is associated with the zones 804 and 812, and, because the zone 812 zone cooling level is higher than the zone 804 zone cooling level, the fan cooling level for the fan module 420 is set to 6000 RPM. Also, the fan module 426 is associated with the zones 806 and 812, and, because the zone 812 zone cooling level is higher than the zone 806 zone cooling level, the fan cooling level for the fan module 426 is set to 6000 RPM. The fan cooling level for the fan module 410, 412, 414, 416, 418, 420, 422, 424, and 426 is then placed on the appropriate output 704 to drive the fan module 410, 412, 414, 416, 418, 420, 422, 424, and 426.

Figure 12:
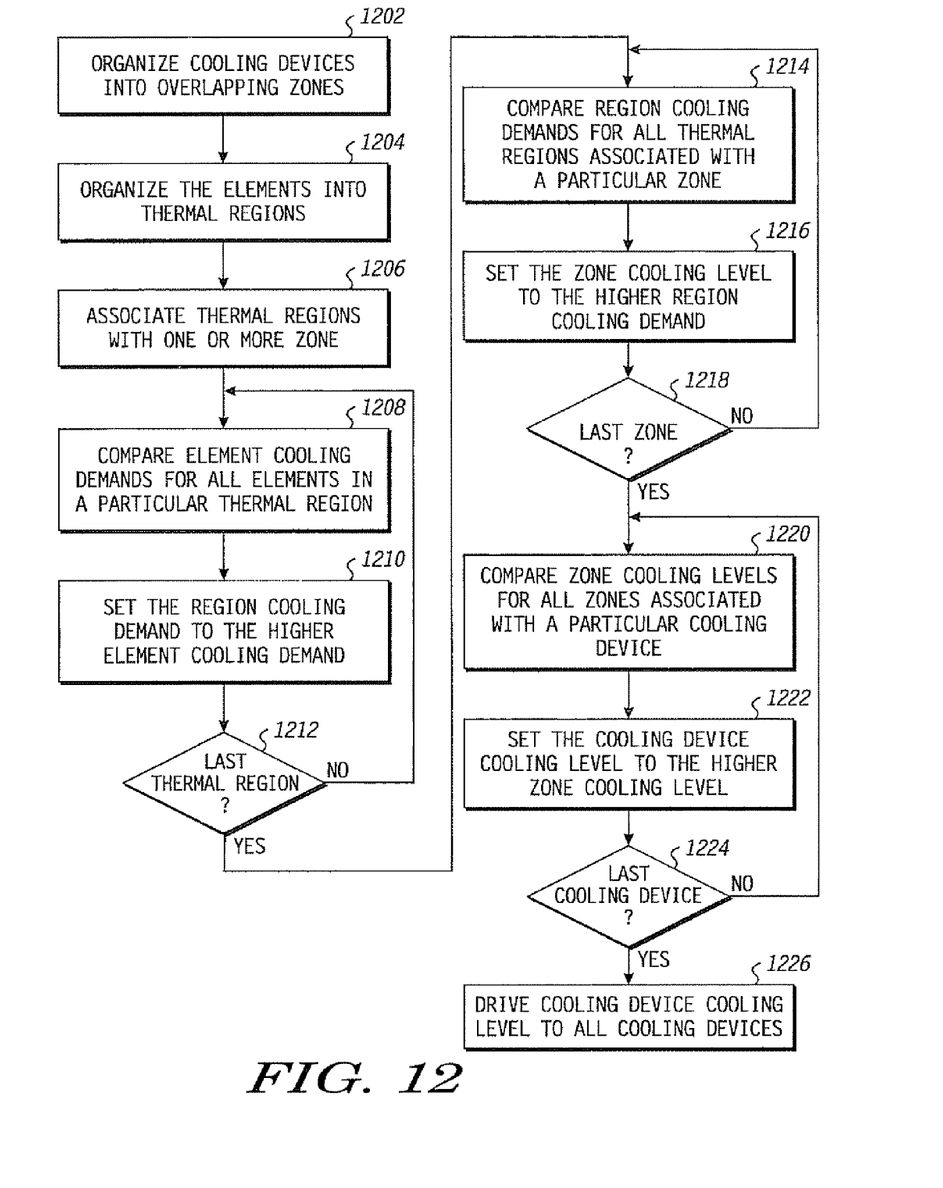
FIG. 12 illustrates a flow diagram of a method of determining a cooling level for cooling devices for an information handling system.

FIG. 12 illustrates an embodiment of controlling cooling devices in an information handling system 100 in a flow chart form. Cooling devices 132 through 134 in the information handling system 100 are organized into overlapping zones in block 1202. The elements of the information handling system 100 are then organized into thermal regions in block 1204. Next, each thermal region is associated with one or more zone in block 1206. The element cooling demands for all elements in a particular thermal region are compared with each other, and the higher element cooling demand is determined in block 1208. The region cooling demand for the particular region is set to substantially equal the higher element cooling demand in block 1210. A decision is made whether the particular thermal region is the last thermal region to have an region cooling demand set in decision tree 1212. If not, then processing returns to compare the element cooling demands for all elements in a next thermal region in block 1208.

If the particular thermal region is the last thermal region (i.e. the "yes" branch of decision tree 1212), the region cooling demands for all thermal regions associated with a particular zone are compared with each other, and the higher region cooling demand is determined in block 1214. The zone cooling level for the particular zone is set to substantially equal the higher region cooling demand in block 1216. A decision is made whether the particular zone is the last zone to have a zone cooling level set in decision tree 1218. If not, then processing returns to compare the region cooling demands for all thermal regions in a next zone in block 1214.

If the particular zone is the last zone to have a zone cooling level set, then the zone cooling levels for all zones associated with a particular cooling device are compared with each other, and the higher zone cooling level is determined in block 1220. The cooling device cooling level for the particular cooling device is set to substantially equal the higher zone cooling level in block 1222. A decision is made whether the particular cooling device is the last cooling device to have a cooling device cooling level set in decision tree 1224. If not, then processing returns to compare the zone cooling levels for all zones associated with a next cooling device in block 1220. If the particular cooling device is the last cooling device to have a cooling device cooling level set, then all cooling devices are driven with the appropriate cooling device cooling level in block 1226.

Many different aspects and embodiments of the present disclosure are possible. Some of those aspects and embodiments are described below. After reading this specification, skilled artisans will appreciate that those aspects and embodiments are only illustrative, and do not limit the scope of the present invention.

In a first aspect, a method can include providing an information handling system with cooling devices that are organized into overlapping zones, wherein each zone includes at least one cooling device, each cooling device belongs to at least two zones, and each zone is associated with thermal regions within the information handling system. The method can also include determining a cooling demand for each thermal region, determining a first cooling level for each zone that corresponds to a higher cooling demand from the thermal regions associated with each zone, and determining a second cooling level for each cooling device that corresponds to a higher first cooling level from the zones to which each cooling device belongs.

In one embodiment of the first aspect, the method can further include setting each cooling device to the second cooling level for each cooling device. In another embodiment, the cooling devices can be organized into rows and columns. In a further embodiment, each row can define a particular zone, and each column can define a different zone. In still another embodiment, the information handling system can include a blade server, and further, the blade server can include a thermal region. In a particular embodiment, the cooling devices can include fans.

In a second aspect, machine-executable code for an information handling system can be embedded within a tangible medium that can include instructions for carrying out a method. The method can include associating zones and cooling devices in the information handling system, wherein each zone is associated with at least one cooling device, and each cooling device is associated with at least two zones. The method can also include determining a first cooling level for each zone, determining a second cooling level for each cooling device by comparing the first cooling level for each zone that is associated with each cooling device, and driving an output for each cooling device that can correspond to the second cooling level for each cooling device.

In one embodiment of the second aspect, the second cooling level for each cooling device can be substantially equal to a higher of the first cooling levels for each zone that is associated with each cooling device. In another embodiment, the cooling devices can be physically arranged in rows and columns, wherein each row can be associated into a particular zone, and each column can be associated into a different zone.

In another embodiment of the second aspect, the information handling system can include thermal sensors, and determining the first cooling level for each zone can include associating zones and thermal sensors, receiving data from the thermal sensors, and determining the first cooling level for each zone by comparing the data from the thermal sensors that are associated with each zone. In a further embodiment, the thermal sensors can communicate thermal data, and the first cooling level for each zone can correspond to a higher thermal data communicated from the thermal sensors that are associated with each zone. In a particular embodiment of the second aspect, the information handling system can include a blade server, and in a further embodiment, the blade server can include a particular thermal sensor of the thermal sensors.

In a third aspect, an information handling system can include an electrical sub-assembly operable to generate thermal energy, a first cooling device associated with a first cooling zone and a second cooling zone, a second cooling device associated with the first cooling zone and a third cooling zone, a third cooling device associated with the second cooling zone and a fourth cooling zone, and a fourth cooling device associated with the third cooling zone and the fourth cooling zone. The information handling system can further include a processor that can receive information regarding thermal energy generated by the electrical sub-assembly, determine a first cooling demand for the first cooling zone in response to receiving a first portion of the information, determine a second cooling demand for the second cooling zone in response to receiving a second portion of the information, and set a first cooling level for the first cooling device based upon a higher of the cooling demands of the first cooling zone and the second cooling zone.

In an embodiment of the third aspect, the processor can also determine a third cooling demand for the third cooling zone in response to receiving a third portion of the information, and set a second cooling level for the second cooling device based upon a higher of the cooling demands of the second cooling zone and the third cooling zone. In another embodiment, the processor can also determine a fourth cooling demand for the fourth cooling zone in response to receiving a fourth portion of the information, and set a third cooling level for the third cooling device based upon a higher of the cooling demands of the third cooling zone and the fourth cooling zone. In a further embodiment, the processor can set a fourth cooling level for the fourth cooling device based upon a higher of the cooling demands of the first cooling zone and the fourth cooling zone. In still another embodiment, the processor can include a chassis management controller. In a particular embodiment, the cooling devices can be organized in rows and columns, each row can be associated with a particular cooling zone, and each column can be associated with a different cooling zone.

Note that not all of the activities described above in the general description, or the examples are required, that a portion of a specific activity may not be required, and that one or more further activities may be performed in addition to those described. Still further, the order in which activities are listed are not necessarily the order in which they are performed.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures, or methods described herein. Many other embodiments may be apparent to those of skill in the art upon reviewing the disclosure. Other embodiments may be used and derived from the disclosure, such that a structural substitution, logical substitution, or another change may be made without departing from the scope of the disclosure. Accordingly, the disclosure is to be regarded as illustrative rather than restrictive.

Certain features are, for clarity, described herein in the context of separate embodiments, may also be provided in combination in a single embodiment. Conversely, various features that are, for brevity, described in the context of a single embodiment, may also be provided separately, or in any sub-combination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur, or become more pronounced are not to be construed as a critical, required, or essential feature of any, or all the claims.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims, and their equivalents, and shall not be restricted, or limited by the foregoing detailed description.

What is claimed is:

1. A method comprising:
    providing an information handling system with cooling devices that are organized into overlapping zones, wherein;
        each zone includes at least one cooling device;
        each cooling device belongs to at least two zones; and
        the each zone is associated with thermal regions within the information handling system;
    determining a cooling demand for each thermal region;
    for the each zone, determining a first cooling level corresponding to a higher cooling demand from the thermal regions associated with the each zone; and
    for the each cooling device, determining a second cooling level corresponding to a higher first cooling level from the zones to which the each cooling device belongs.

2. The method of claim 1, further comprising setting each cooling device to the second cooling level for the each cooling device.

3. The method of claim 1, wherein the cooling devices are organized into rows and columns.

4. The method of claim 3, wherein:
    each row defines a particular zone; and
    each column defines a different zone.

5. The method of claim 1, wherein the information handling system comprises a blade server.

6. The method of claim 5, wherein the blade server comprises a thermal region.

7. The method of claim 1, wherein the cooling devices comprise fans.

8. Machine-executable code for an information handling system, wherein the machine-executable code is embedded within a tangible medium and includes instructions for carrying out a method comprising:
    associating zones and cooling devices in the information handling system, wherein;
        each zone is associated with at least one cooling device; and
        each cooling device is associated with at least two zones;

determining a first cooling level for the each zone;
for the each cooling device, determining a second cooling level by comparing the first cooling level for the each zone that is associated with the each cooling device; and
for the each cooling device, driving an output that corresponds to the second cooling level for the each cooling device.

9. The machine-executable code of claim 8, wherein, for the each cooling device, the second cooling level is substantially equal to a higher of the first cooling levels for the each zone that is associated with the each cooling device.

10. The machine-executable code of claim 8, wherein:
the cooling devices are physically arranged in rows and columns; and wherein
 each row is associated into a particular zone; and
 each column is associate into a different zone.

11. The machine-executable code of claim 8, wherein:
the information handling system comprises thermal sensors; and
determining the first cooling level for the each zone further comprises:
 associating zones and thermal sensors;
 receiving data from the thermal sensors; and
 for the each zone, determining the first cooling level by comparing the data from the thermal sensors that are associated with the each zone.

12. The machine-executable code of claim 11, wherein:
the thermal sensors communicate thermal data; and
for the each zone, the first cooling level corresponds to a higher thermal data communicated from the thermal sensors that are associated with the each zone.

13. The machine-executable code of claim 11, wherein the information handling system comprises a blade server.

14. The machine-executable code of claim 13, wherein the blade server provides a particular thermal sensor of the thermal sensors.

15. An information handling system comprising:
an electrical sub-assembly operable to generate thermal energy;
a first cooling device associated with a first cooling zone and a second cooling zone;
a second cooling device associated with the first cooling zone and a third cooling zone;
a third cooling device associated with the second cooling zone and a fourth cooling zone;
a fourth cooling device associated with the third cooling zone and the fourth cooling zone; and
a processor operable to:
 receive information regarding thermal energy generated by the electrical sub-assembly;
 for the first cooling zone, determine a first cooling demand in response to receiving a first portion of the information;
 for the second cooling zone, determine a second cooling demand in response to receiving a second portion of the information; and
 for the first cooling device, set a first cooling level based upon a higher of the cooling demands of the first cooling zone and the second cooling zone.

16. The information handling system of claim 15, wherein the processor is further operable to:
for the third cooling zone, determine a third cooling demand in response to receiving a third portion of the information; and
for the second cooling device, set a second cooling level based upon a higher of the cooling demands of the second cooling zone and the third cooling zone.

17. The information handling system of claim 16, wherein the processor is further operable to:
for the fourth cooling zone, determine a fourth cooling demand in response to receiving a fourth portion of the information; and
for the third cooling device, set a third cooling level based upon a higher of the cooling demands of the third cooling zone and the fourth cooling zone.

18. The information handling system of claim 17, wherein for the fourth cooling device, the processor is further operable to set a fourth cooling level based upon a higher of the cooling demands of the first cooling zone and the fourth cooling zone.

19. The information handling system of claim 15, wherein the processor comprises a chassis management controller.

20. The information handling system of claim 15, wherein:
the cooling devices are organized in rows and columns;
each row is associated with a particular cooling zone; and
each column is associated with a different cooling zone.

* * * * *